United States Patent [19]

Akahane

[11] Patent Number: 5,792,994
[45] Date of Patent: Aug. 11, 1998

[54] DEVICE FOR MOUNTING A COMPONENT

[75] Inventor: Masamitsu Akahane, Tokyo, Japan

[73] Assignee: Mitsubishi Denki Kabushiki Kaisha, Tokyo, Japan

[21] Appl. No.: 693,963

[22] Filed: Aug. 7, 1996

[30] Foreign Application Priority Data

Aug. 9, 1995 [JP] Japan ................... 7-203702

[51] Int. Cl.$^6$ ................................. H01B 17/00
[52] U.S. Cl. ................... 174/138 G; 361/807; 439/567; 403/405.1; 248/309.1
[58] Field of Search ................... 174/138 G, 138 H, 174/138 J; 361/807, 808, 767, 742, 717, 809, 820, 825; 248/309.1, 316.7, 300; 403/329, 326, 327, 405.1; D8/354; 439/567

[56] References Cited

U.S. PATENT DOCUMENTS

| 4,589,794 | 5/1986 | Sugiura et al. | 403/187 |
|---|---|---|---|
| 4,602,122 | 7/1986 | Lint | 174/52 R |
| 5,117,330 | 5/1992 | Miazga | |
| 5,171,165 | 12/1992 | Hwang | 439/567 |
| 5,274,193 | 12/1993 | Bailey et al. | 174/16.3 |
| 5,478,025 | 12/1995 | Wang | 242/414.1 |

FOREIGN PATENT DOCUMENTS

| 0148461 | 7/1985 | European Pat. Off. |
| 60-111097 | 7/1985 | Japan |
| 62-154699 | 10/1987 | Japan |
| 63-71573 | 5/1988 | Japan |
| 3-37273 | 8/1991 | Japan |
| 55-347491 | 12/1993 | Japan |
| 2168200 | 6/1986 | United Kingdom |
| 2255675 | 11/1992 | United Kingdom |

*Primary Examiner*—Kristine L. Kincaid
*Assistant Examiner*—Dhiru R. Patel

[57] ABSTRACT

A device for mounting a component such as a shielding case on a printed circuit board includes a base, at least one leg, and at least a first resilient wall rising from the base. The leg extends from the base and is, for example, soldered to the printed circuit board. The first wall has either a hole engaged with a projection formed in the shielding case, or a projection engaged with a hole formed in the shielding case. The first wall detachably engages the shielding case to hold the shielding case in place. The device may have additional walls, i.e., a second wall that opposes the first wall and a third wall that is in the same plane as the first wall rises. The first and second walls hold the wall of the shielding case therebetween in sandwiched relation, the shielding case being inserted into the printed circuit board from the component side of the printed circuit board. The third wall engages, for example, a shielding plate to the shielding plate in place, the shielding plate being inserted into the printed circuit board from the pattern side of the printed circuit board.

14 Claims, 6 Drawing Sheets

DEVICE FOR MOUNTING A COMPONENT

BACKGROUND OF THE INVENTION

The present invention relates to a device for mounting components such as a shielding case on a printed circuit board.

FIG. 11 is a cross-sectional view showing a shielding case and a shielding plate which are mounted in a conventional manner. Referring to FIG. 11, a shielding case 9 encloses components mounted on the components side of the printed circuit board (referred to as PCB hereinafter). The shielding case 9 has legs 9a which are inserted through holes 8a into the PCB 8 and soldered to a copper foil pattern 8b by means of solder 11. A shielding plate 10 covers the copper foil pattern side of the PCB 8. The shielding plate 10 has legs 10a that are inserted through holes 8a into the PCB 8 and are soldered to the copper foil pattern 8b by means of solder 11. The copper foil pattern 8b is the ground that cooperates with the shielding case 9 and shielding plate 10 to enclose the electric circuit in order to shield the electric circuit 1 from electromagnetic interference.

FIG. 12 shows another construction proposed in order to facilitate replacement of parts enclosed by the shielding case 9. This construction is of two-piece construction including a shielding wall 15 that surrounds the electric circuit and a shielding cover 16 that covers the top opening of the shielding wall 15. After the shielding wall 15 is soldered to the PCB 8, the shielding cover 16 is fitted onto the shielding wall 15 to cover the top opening, being in electrical contact with the shielding wall 15 to entirely shield the components on the PCB 8.

As described above, components such as the shielding case 9 and shielding plate 10 are conventionally soldered directly to the PCB 8. These components are odd-shaped and therefore usually soldered manually at a plurality of portions thereof with a large amount of solder as opposed to other components. Such manual assembly operation is time consuming and therefore not economical. Moreover, if some components are to be replaced when repairing, the shielding case 9 and shielding plate 10 must be unsoldered. Unsoldering these odd-shaped components often necessitates simultaneous heating the soldered portions in order to dismount them from the PCB.

SUMMARY OF THE INVENTION

An object of the invention is to provide an device which facilitates the mounting of an odd-shaped component such as a shielding case on a printed circuit board and the dismounting of the component from the printed circuit board.

The device includes a base, at least one leg, and at least a first resilient wall rising from the base. The leg extends from the base and is securely mounted to a printed circuit board by, for example, soldering. The first wall has an engagement portion which is engaged with a part of, for example, a shielding case. The engagement portion is either a hole or a projection engaged with either a projection or a hole, respectively, formed in the shielding case. The resilient first wall detachably engages the shielding case to hold the component in place.

The device may have additional walls, i.e., a second wall that opposes the first wall and a third wall that is in the same plane as that in which the first wall rises. The first and second walls hold the shielding case therebetween in sandwiched relation, the shielding case being inserted into the printed circuit board from the component side of the printed circuit board. The third wall engages, for example, a shielding plate inserted into the printed circuit board from the pattern side of the printed circuit board opposing the component side. In this manner, the device holds both the shielding case and shielding plate simultaneously.

DETAILED DESCRIPTION OF THE PREFERRED EMBODIMENTS

First embodiment

Figure 1:
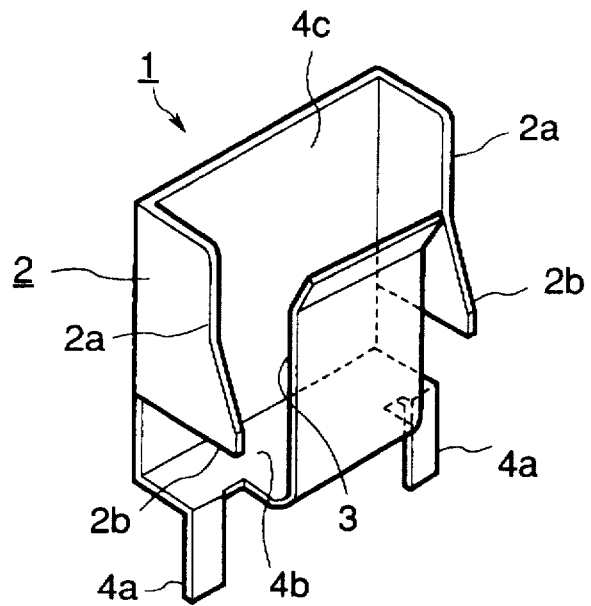
FIG. 1 is a perspective view of a device for mounting a component according to a first embodiment.
Figure 2:
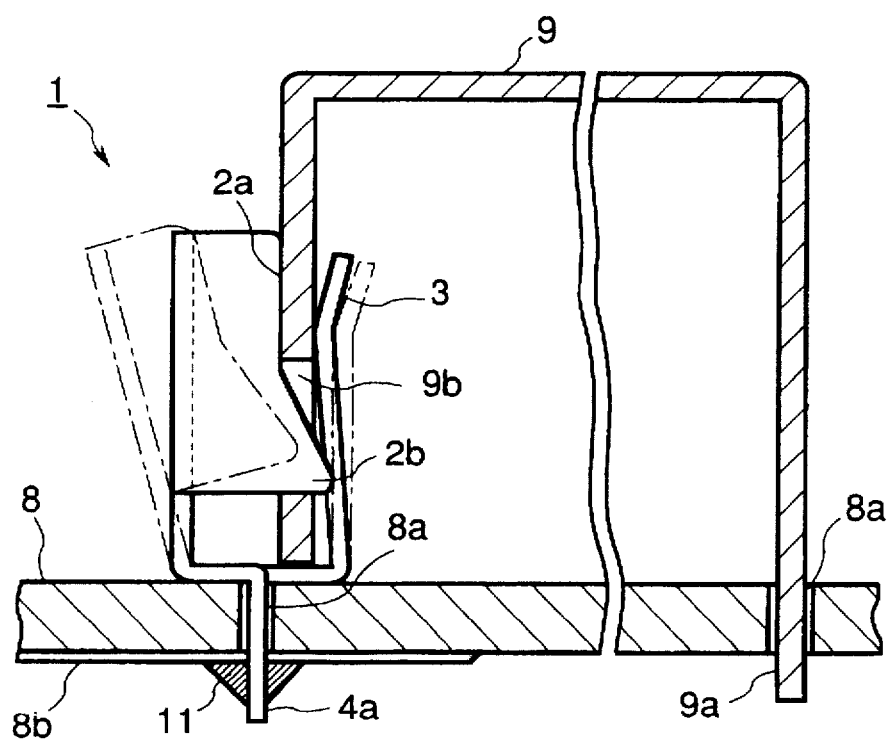
FIG. 2 is a cross-sectional view of a component, for example, a shielding case as being mounted to a PCB using the device shown in FIG. 1.

A device for mounting a component according to a first embodiment will now be described with reference to FIGS. 1 and 2. FIG. 1 is a perspective view of a device for mounting a component of the first embodiment. FIG. 2 is a cross-sectional view of a component, for example, a shielding case as being mounted to a PCB using the device shown in FIG. 1. Referring to FIG. 1, a device 1 is of folded construction formed of a resilient metal sheet, and is used for mounting a shielding case 9 to a PCB 8. The device includes a horizontal base 4b and vertical wall 4c bent at a substantially right angle with respect to the horizontal base 4b. The device 1 has two side flaps 2 which are inwardly bent at substantially right angles with respect to the vertical wall 4c and laterally extend in parallel to each other. The device 1 also has a tongue 3 which is bent at an angle slightly less than right angle with respect to the horizontal base 4b and extends upward substantially in parallel with the vertical wall 4c between the side flaps 2. Each of side flaps 2 projects into a hole 9b formed in the shielding case 9 upon assembly of the shielding case 9 into the device 1, cooperating with the tongue 3 to hold the wall of the shielding case 9 therebetween. The device 1 has two legs 4a at two opposing ends thereof, the legs 4a being bent and extending downward. The device 1 is soldered to the PCB 8 at the legs 4a when assembled to the PCB 8. The side flap 2 has a guide 2a at its side edge and a projection 2b. The guide 2a guides the lower end of the shielding case 9 when the shielding case 9 is inserted into the device 1.

The device 1 is mounted on the PCB 8 by inserting the legs 4a into the mounting holes 8a, and is soldered together with other electrical components on the PCB 8 by means of flow soldering. After soldering, the shielding case 9 is assembled to the device 1 by inserting the wall of the shielding case 9 between the guides 2a and the tongue 3. As the shielding case 9 is inserted, the wall pushes the side flaps 2 and the tongue 3 out of the way. The vertical wall 4c and the tongue 3 are yieldably deflected away from each other as depicted by dot-dash lines shown in FIG. 2, facilitating the insertion of the shielding case 9. When the shielding case 9 has been fully inserted, the projections 2b, operating as engagement portions, pop into the holes 9b, operating as complementary engagement portions, and the vertical wall 4c and the tongue 3 regaining their original positions. The engagement of the projections 2b with the holes 9b holds the shielding case 9 between the guides 2a and the tongue 3, and prevents the drop-out of the shielding case 9 from the PCB 8. This establishes electrical connection between the shielding case 9 and the copper foil pattern 8b.

The shielding case 9 has legs 9a extending downward from the wall opposing the wall in which the holes 9b are formed. The legs 9a are inserted into the mounting holes 8a, serving to place the shielding case 9 in position. Projections similar to the projections 2b may be formed on the shielding case 9 and holes similar to the holes 9b may be formed in the tongue 3 or in the vertical wall 4c of the device 1, so that mechanical and electrical effects similar to those obtained by the aforementioned projections 2 and holes 9b may also be obtained. An example of such a modification will be later described with reference to FIGS. 8–10.

When dismounting the shielding case 9 from the PCB 8, the vertical wall 4c is pulled slightly away from the shielding case 9 till the projections 2b disengage from the holes 9b and then the shielding case 9 is pulled upwardly.

According to the first embodiment, the projections 2 projecting into the holes 9b allows firm holding of the shielding case 9 to the PCB 8 without soldering, facilitating smooth and easy mounting and dismounting of the shielding case 9. Simultaneous soldering of the device with other electrical components by flow soldering simplifies manufacturing process of the PCB 8.

Second embodiment

Figure 3:
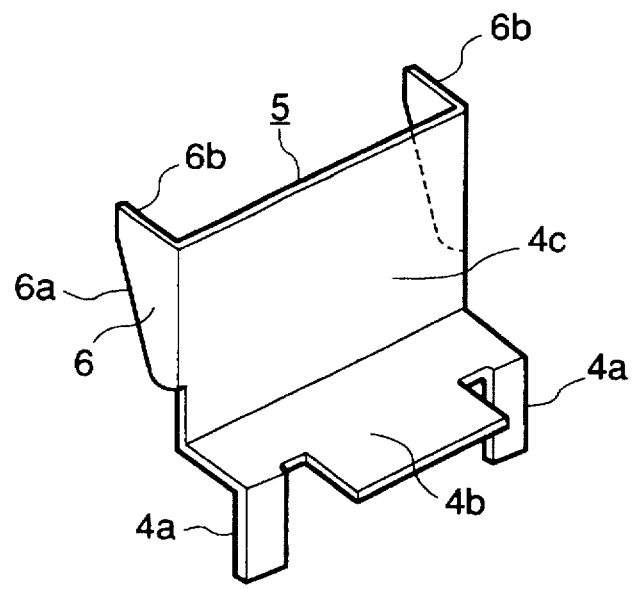
FIG. 3 is a perspective view of a device for mounting a component according to a second embodiment.
Figure 4:
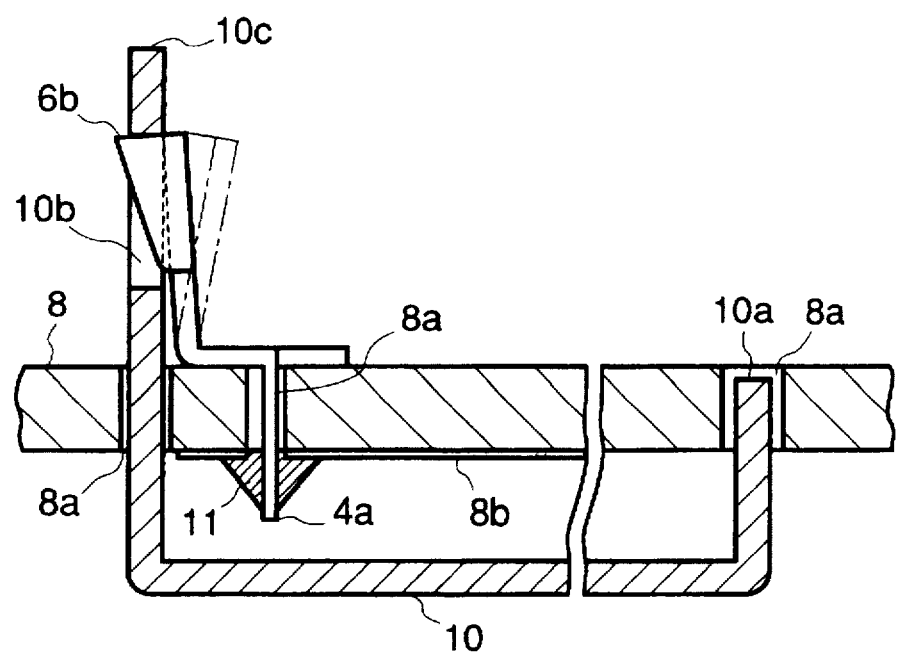
FIG. 4 is a cross-sectional view of the device shown in FIG. 3 as being mounted together with a shielding plate 10 to a PCB.

FIG. 3 is a perspective view of a device according to a second embodiment. FIG. 4 is a cross-sectional view showing the device as being mounted together with a shielding plate 10 to a PCB using the device shown in FIG. 3. Referring to FIG. 3, the device 5 is of bent construction formed of a resilient metal sheet, and is used for mounting a shielding plate 10 to a PCB 8. The device 5 includes a horizontal base 4b and vertical wall 4c bent at a substantially right angle with respect to the horizontal base 4b. The device 5 has two side flaps 6 which are outwardly bent at substantially right angles with respect to the vertical wall 4c and laterally extend in parallel with each other, and two legs 4a extending downwardly. The side flap 6 has a guide 6a and a projection 6a. The shielding plate 10 has holes 10b into which the side flaps 6 project.

The device 5 is mounted on a first side of the PCB 8 by inserting the legs 4a into the mounting holes 8a, and is soldered together with other electrical components on a second side 9b of the PCB 8 by means of flow soldering. After soldering, the shielding plate 10 is assembled to the device 1 by inserting legs 10c of the shielding plate 10 through the holes 8a from the second or copper foil pattern side 9b of the PCB 8 to the opposite PCB side 9a. The legs pushes the projections 6a out of the way as they advances through the holes 8a. The side flaps 6 are yieldably deflected as depicted by dot-dash lines shown in FIG. 2, facilitating the insertion of the shielding plate 10. Upon completion of the insertion of the shielding plate 10, the vertical wall 4c regain its original position as shown in solid lines with the result that the projections 6b drop into the holes 9b, thereby preventing the pull-out of the shielding plate 10 from the PCB 8 as well as establishing electrical connection between the shielding plate 10. The legs 10a at the other end of the shielding plate 10 are inserted into the mounting holes 8a, serving to place the shielding plate 10 in position.

Projections similar to the projections 6b may be formed on the shielding plate 10, and holes similar to the holes 10b may be formed in the device 5, so that mechanical and electrical effects similar to those obtained by the aforementioned projections 6b and holes 10b may also be obtained. If the shielding plate 10 is to be formed with projections similar to the projections 6, the PCB needs to be formed with slit-like holes through which the projections may pass. The second embodiment offers the same advantages as the first embodiment.

When dismounting the shielding plate 10 from the PCB 8, the vertical wall 4c is pulled slightly away from the legs 10c of the shielding plate 10 till the projections 6b disengage from the holes 10b, and the shielding plate 10 is then pulled downwardly.

Third embodiment

Figure 5:
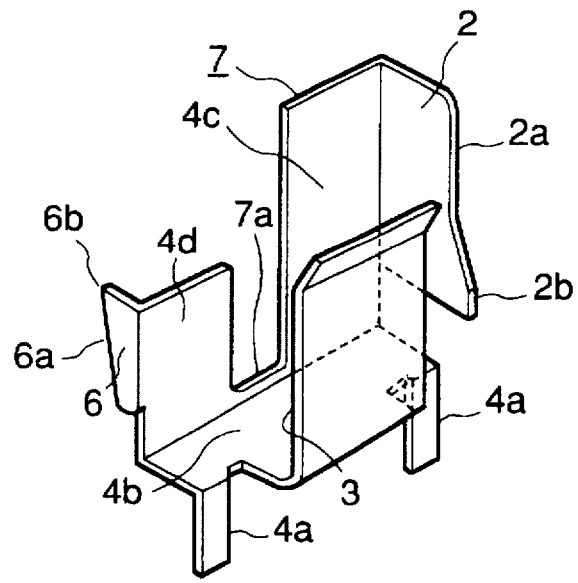
FIG. 5 is a perspective view of a device for mounting a component according to a third embodiment.
Figure 6:
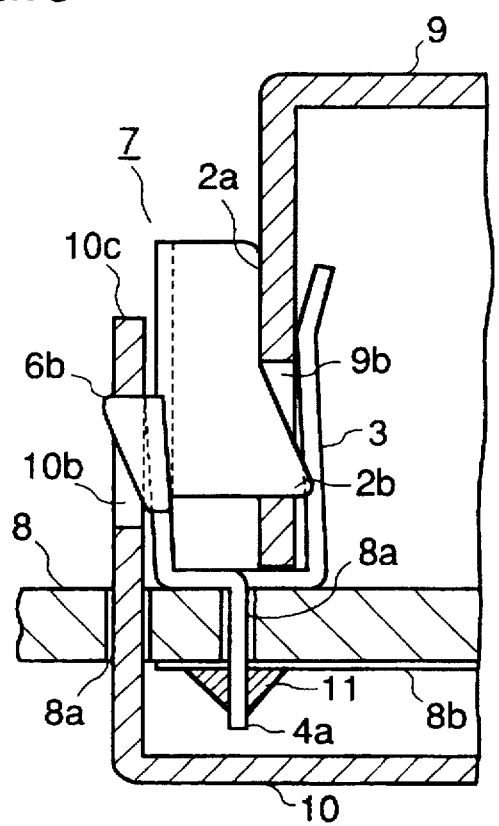
FIG. 6 is a cross-sectional view of components such as a shielding case and shielding plate as being mounted to a PCB using the device shown in FIG. 5.

A third embodiment is a combination of the devices according to the first and second embodiments. FIG. 5 is a perspective view of a device for mounting a component according to the third embodiment. FIG. 6 is a cross-sectional view of components such as a shielding case and shielding plate as being mounted to a PCB using the device shown in FIG. 5. Referring to FIG. 5, a device 7 has a horizontal base 4b and vertical walls 4c and 4d. The vertical walls 4c and 4d are separated by a U-shaped cutout 7a so that the vertical walls 4c and 4d are adapted to deflect independently of each other. The vertical wall 4c has a side flap 2 inwardly bent at a substantially right angle while the vertical wall 4d has a side flap 6 outwardly bent at a substantially right angle. The shielding case 9 and shielding plate 10 are inserted into the device 7 in the same manner as in the first and second embodiments.

Just as in the first and second embodiments, a modification may be made so that the device 5 is formed with holes instead of projections 2b and 6b and the shielding case 9 and shielding plate 10 are formed with projections instead of holes 9b and 10b.

In addition to the advantages provided in the first and second embodiment, a single device 7 permits mounting of a plurality of components, thereby reducing the total number of components mounted on the PCB 8. This improves assembly efficiency of the PCB.

The shielding plate 10 and shielding case 9 may be dismounted in much the same as in the first and second embodiments.

Fourth embodiment

Figure 7:
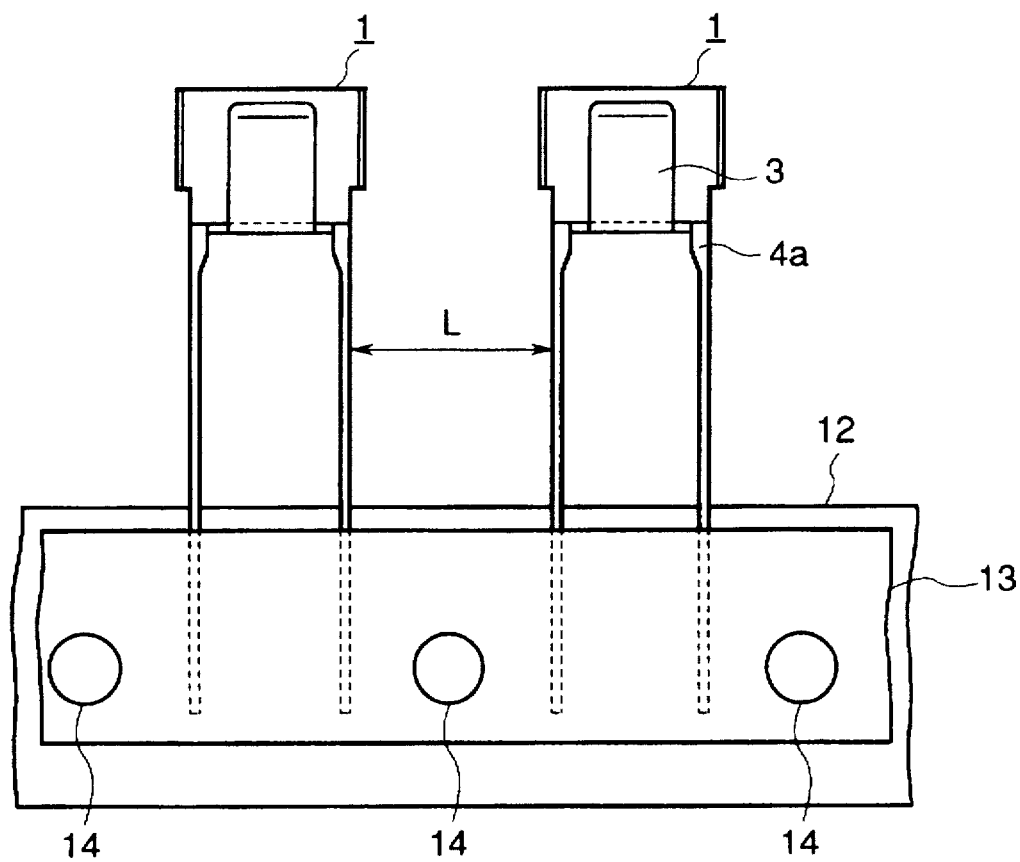
FIG. 7 illustrates devices according to a fourth embodiment as being mounted on a tape.

The devices 1, 5, and 7 in the first to third embodiments may be modified by forming the legs 4a into a lead-like shape so that the devices may be mounted at the legs 4a on a tape-like carrier. This tape construction allows automatic mounting of the devices to the PCB 8 using an automatic parts mounter. FIG. 7 illustrates modified devices 1 of the first embodiment, mounted on a carrier in the form of a tape. Referring to FIG. 7, the modified devices 1 are aligned at a predetermined distance L therebetween with their legs 4a sandwiched between a tape 13 and a paper base 12 to which the tape is attached. The tape-like carrier is advanced by an automatic parts mounter, not shown, by means of sprocket holes 14 formed in the tape 12 and paper base 13. The fourth embodiment allows mounting of the modified device 1 together with other electrical components on the PCB 8 using an automatic parts mounter, significantly improving assembly efficiency. The construction of the fourth embodiment may also be applicable to the devices 5 and 7 and a later described device 15 if their legs are formed in a shape of a lead similar to that of the aforementioned modified device 1.

Fifth embodiment

Figure 8:
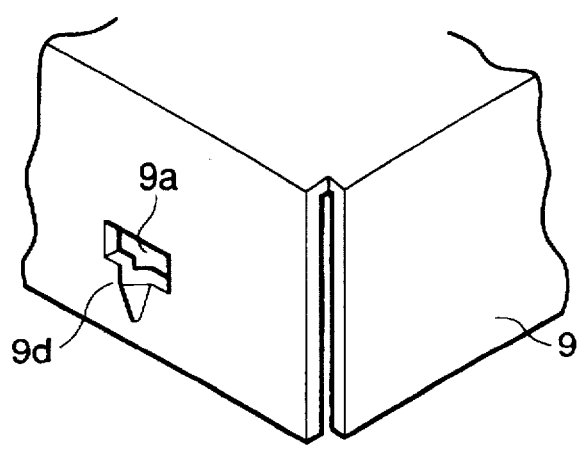
FIG. 8 is a fragmentary perspective view of a shielding case to which a device according to a fifth embodiment is applicable.
Figure 9:
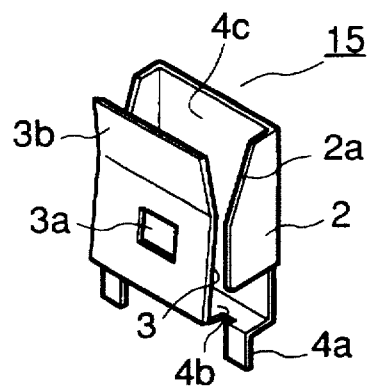
FIG. 9 is a perspective view of an device according to a fifth embodiment.
Figure 10:
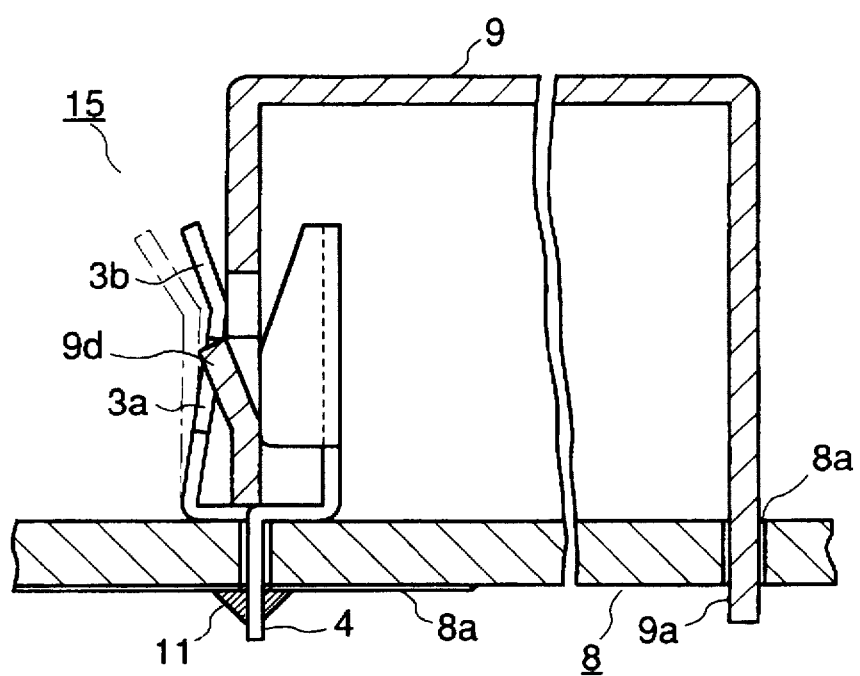
FIG. 10 is a cross-sectional view of the device shown in FIG. 9 as being mounted together with a shielding case shown in FIG. 10 to a PCB.
Figure 11:
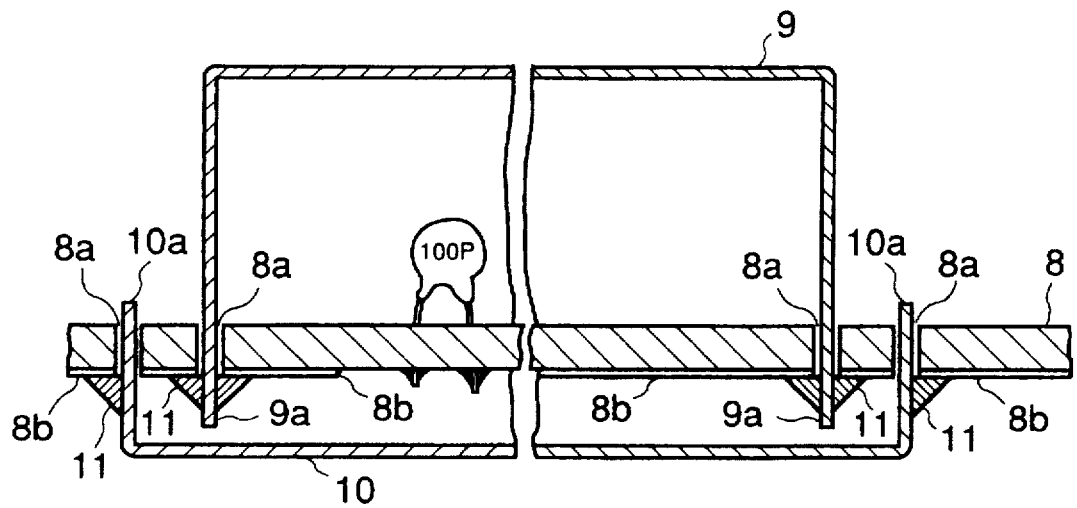
FIG. 11 is a cross-sectional view showing a shielding case and shielding plate which are mounted on a PCB in a conventional manner.
Figure 12:
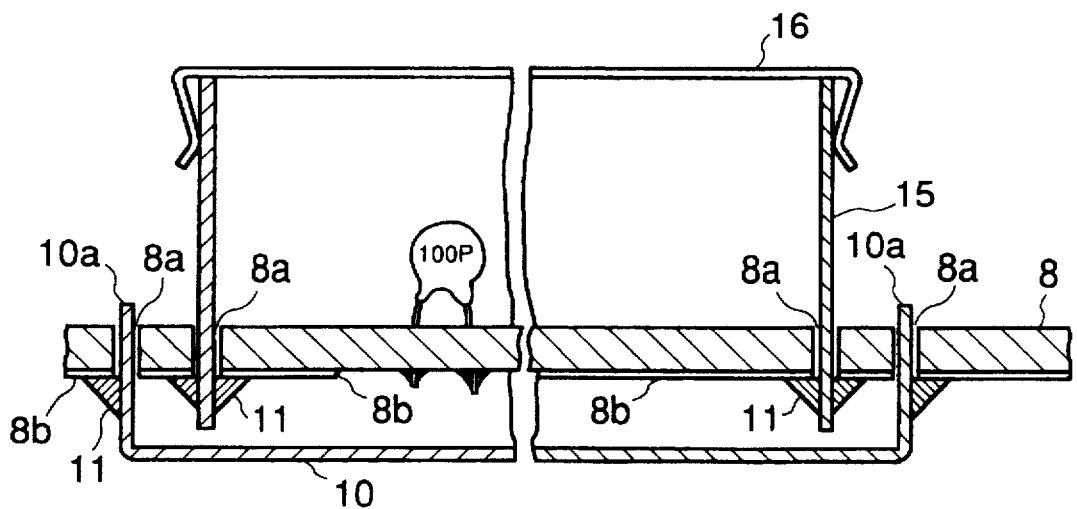
FIG. 12 shows another construction proposed in order to facilitate replacement of components enclosed by the shielding case.

The first to fourth embodiments have been described with respect to a device having projections 2b and 6b which engage holes 9b and 10b in the components. A fifth embodiment is a modification of that shown in FIGS. 1 and 2. The fifth embodiment differs from the first to fourth embodiments in that a device for mounting a component has a hole formed therein as an engagement portion which is engaged with a projection formed on a shielding case as a complementary engagement portion. FIG. 8 is a fragmentary perspective view of a shielding case 9, showing a modification of the construction shown in FIGS. 1 and 2. The shielding case 9 has a hole 9a and a projection 9d that projects outwardly of a part of the wall defining the hole 9a. FIG. 9 is a perspective view of a device 15 for mounting a component according to the fifth embodiment. The tongue 3 is formed with a hole 3a therein. FIG. 10 is a cross-sectional view of a component, for example, a shielding case 9 as being mounted to a PCB using the device 15 shown in FIG. 9. After fixedly mounting the device 15 to the PCB 8 by means of soldering, the shielding case 9 is descended from above so that the wall of the shielding case 9 is received between the tongue 3 and the vertical wall 4c. As the shielding case 9 is further descended, the projection 9d of the shielding case 9 pushes the tongue 3 out of the way and then pops into the hole 3a. Once the projection 9d projects into the hole 3a, the tongue 3 regains its original position with a snap action, firmly holding the shielding case 9 in position.

When dismounting the shielding case 9 from the PCB 8, the tongue 3 is pulled slightly away from the shielding case 9 till the projection 9d disengages from the hole 3a and the shielding case 9 is then pulled downwardly.

What is claimed is:

1. A device for detachably mounting at least one component on a printed circuit board, said device comprising:

a base disposable on a first side of the printed circuit board;

at least one leg extending generally vertically downward from said base and extendable through the printed circuit board for securance to a second side of the printed circuit board;

at least one resilient wall rising generally vertically from said base in a direction away from the first side of the printed circuit board when said device is secured to the printed circuit board;

said one wall having at least one member bent outwardly along a substantially vertically extending line to project outwardly substantially in the horizontal direction, said member causing said one wall to deflect, as a whole, away from the component when the component is placed against said wall member and moved vertically toward the printed circuit board for mounting thereon; and said one wall having at least one engagement portion for engaging a complementary engagement portion of the component, when the component is placed against the printed circuit board and said one wall has returned from its deflected position, thereby to hold the component detachably in place.

2. The device according to claim 1, wherein said one wall engagement portion is a hole which receives a part of the component to hold the component in place.

3. The device according to claim 1, wherein said device is electrically conductive and electrically connected through the one leg to an electrically conductive pattern disposed on a second set of the printed circuit board.

4. The device according to claim 1, wherein said wall includes a first wall and a resilient second wall rises from said base and opposes said first wall, said first and second walls being resilient and detachably holding a part of the component between said first wall and said second wall in sandwiched relation.

5. The device according to claim wherein said at least one component is a first and second component and a third resilient wall rises from said base in the same plane as that in which said first wall rises from said base, said first and second walls detachably holding said first component therebetween, and said third wall having an engagement portion for engaging said second component to hold the second component detachably in place.

6. The device according to claim 1, wherein said engagement portion is a projection which engages a hole formed in the component to hold the component in place.

7. The device according to claim 1, wherein said device, being mountable on the first side of the printed circuit board, has said wall member disposed to cause deflection of said one wall when the component is moved toward the second side of the printed circuit board with a part of the component extending through the printed circuit board into engagement with said wall member; said engagement portion of said one wall and the complementary engagement portion of the component engaging each other when the component is placed against the second side of the printed circuit board.

8. A combination of a component and a device for mounting said component on a printed circuit board, wherein said device comprises:

a base disposable on a first side of the printed circuit board;

at least one leg extending substantially vertically downward from said base and extendable through the printed circuit board for securance to a second side of the printed circuit board;

at least one resilient wall rising substantially vertically from said base in a direction away from the first side of the printed circuit board when said device is secured to the printed circuit board;

said one wall having at least one member bent outwardly along a substantially vertically extending line to project outwardly substantially in the horizontal direction, said member causing said one wall to deflect, as a whole, away from the component when the component is placed against said wall member and moved vertically toward the printed circuit board for mounting thereon; and said one wall having at least one first engagement portion for engaging the component, when the component is placed against the printed circuit board and said one wall has returned from its deflected position, thereby to hold the component detachably in place; and wherein said component comprises:

at least one wall having at least one second engagement portion complementary to and engaged with said first one engagement portion of said device.

9. The combination according to claim 8, wherein said first engagement portion is a hole and said second engagement portion is a part of the component which is received in said hole.

10. The combination according to claim 8, wherein said first engagement portion is a projection and said second engagement portion is a hole which is engaged with said projection.

11. The combination of claim 8 wherein said component is a shielding case having a wall structure which includes said one component wall.

12. The combination of claim 8 wherein said one engagement portion of said one wall is an outer end section of said vertically extending member.

13. An assembly of devices for mounting a component on a printed circuit board, comprising:

paperbase;

tape attached to said paper base;

a plurality of devices aligned at predetermined intervals, each of said devices having at least one leg held in a sandwiched relation between said tape and said paper base, wherein each of said devices each include:

a base disposable on a first side of the printed circuit board and having said leg extending substantially downward from said base when said leg is extended through the printed circuit board for securance to a second side of the printed circuit board;

at least one resilient wall rising substantially vertically from said base in a direction away from the first side of the printed circuit board when at least one of said plurality of devices is secured to the printed circuit board;

said one wall having at least one member bent outwardly along a substantially vertically extending line to project outwardly substantially in the horizontal direction, said member causing said one wall to deflect, as a whole, away from the component when the component is placed against said wall member and moved vertically toward the printed circuit board for mounting thereon; and said one wall having at lease one engagement portion for engaging the component, when the component is placed against the printed circuit board and said one wall has returned from its deflected position, thereby to hold the component detachably in place;

wherein the at least one of said plurality of devices is separated from said tape by cutting through said leg prior to mounting the at least one of said plurality of devices on the printed circuit board.

14. The device assembly according to claim 13, wherein said engagement portion is a projection which engages a hole formed in the component to hold the component in place.

* * * * *